(12) United States Patent
Wong et al.

(10) Patent No.: US 7,022,566 B2
(45) Date of Patent: Apr. 4, 2006

(54) INTEGRATED RADIO FREQUENCY CIRCUITS

(75) Inventors: Ting-Wah Wong, Cupertino, CA (US); Chong L. Woo, Fremont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/192,994

(22) Filed: Jul. 11, 2002

(65) Prior Publication Data

US 2002/0179977 A1    Dec. 5, 2002

Related U.S. Application Data

(60) Division of application No. 09/948,271, filed on Sep. 6, 2001, now abandoned, which is a continuation-in-part of application No. 09/792,848, filed on Feb. 23, 2001, now abandoned, which is a continuation-in-part of application No. 09/596,486, filed on Jun. 19, 2000, now abandoned, which is a continuation-in-part of application No. 09/580,713, filed on May 30, 2000, now abandoned.

(51) Int. Cl.
    *H01L 21/8238*    (2006.01)
    *H01L 29/00*    (2006.01)

(52) U.S. Cl. .................. 438/228; 438/238; 257/531; 257/548

(58) Field of Classification Search ............... 257/367, 257/368, 369, 370, 371, 531, 544, 548–550, 257/577, 773, 204, 206; 438/210, 223, 224, 438/227, 228, 233, 238, 328, 329, 330, 381, 438/128, 129, 200, 234, 309
See application file for complete search history.

(56) References Cited

U.S. PATENT DOCUMENTS

| | | | | |
|---|---|---|---|---|
| 5,272,366 A | * | 12/1993 | Sei et al. ..................... | 257/206 |
| 5,336,915 A | * | 8/1994 | Fujita et al. ................. | 257/369 |
| 5,473,183 A | * | 12/1995 | Yonemoto .................... | 257/371 |
| 5,610,550 A | * | 3/1997 | Furutani ...................... | 257/371 |
| 5,936,282 A | * | 8/1999 | Baba et al. .................. | 257/355 |
| 6,011,293 A | * | 1/2000 | Yuzuriha et al. ............. | 257/380 |
| 6,016,002 A | * | 1/2000 | Chen et al. .................. | 257/546 |
| 6,025,621 A | * | 2/2000 | Lee et al. ..................... | 257/296 |
| 6,055,655 A | * | 4/2000 | Momohara ................... | 714/723 |
| 6,127,892 A | | 10/2000 | Komurasaki et al. | |

(Continued)

FOREIGN PATENT DOCUMENTS

| | | | | |
|---|---|---|---|---|
| EP | 0 911 974 A | | 4/1999 | |
| EP | 1 071 132 A2 | | 1/2001 | |
| GB | 2 352 559 A | | 1/2001 | |
| JP | 06-163823 | * | 6/1994 | ...................... 27/8 |
| JP | 06-314773 | * | 11/1994 | ...................... 27/8 |

*Primary Examiner*—Ori Nadav
(74) *Attorney, Agent, or Firm*—Martine Penilla & Gencarella, LLP

(57) ABSTRACT

An RF circuit may be formed over a triple well that creates two reverse biased junctions. By adjusting the bias across the junctions, the capacitance across the junctions can be reduced, reducing the capacitive coupling from the RF circuits to the substrate, improving the self-resonance frequency of inductors and reducing the coupling of unwanted signals and noise from the underlying substrate to the active circuits and passive components such as the capacitors and inductors. As a result, radio frequency devices, such as radios, cellular telephones and transceivers such as Bluetooth transceivers, logic devices and Flash and SRAM memory devices may all be formed in the same integrated circuit die using CMOS fabrication is processes.

14 Claims, 14 Drawing Sheets

U.S. PATENT DOCUMENTS

| | | | |
|---|---|---|---|
| 6,133,079 A * | 10/2000 | Zhu et al. | 438/210 |
| 6,153,914 A * | 11/2000 | Mulatti et al. | 257/372 |
| 6,207,998 B1 * | 3/2001 | Kawasaki et al. | 257/371 |
| 6,258,634 B1 * | 7/2001 | Wang et al. | 438/133 |
| 6,274,898 B1 * | 8/2001 | Mehta et al. | 257/298 |
| 6,369,427 B1 * | 4/2002 | Williamson | 257/355 |

* cited by examiner

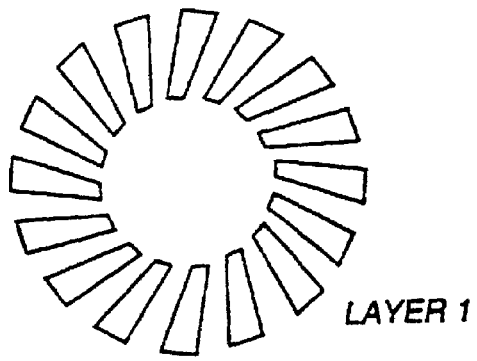
FIG. 11 — LAYER 1
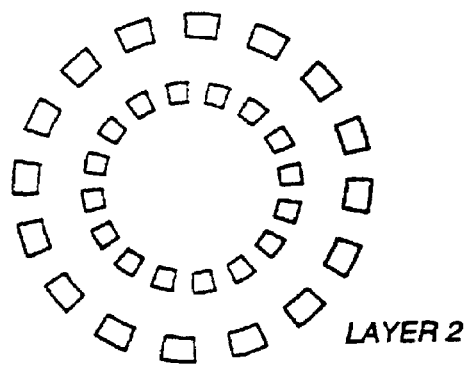
FIG. 12 — LAYER 2
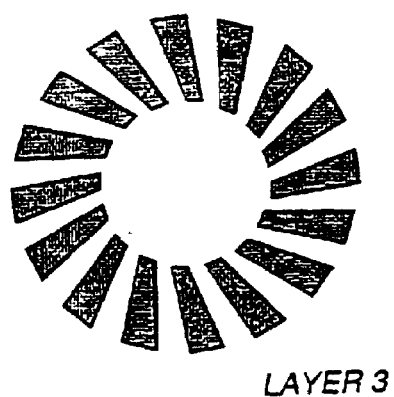
FIG. 13 — LAYER 3
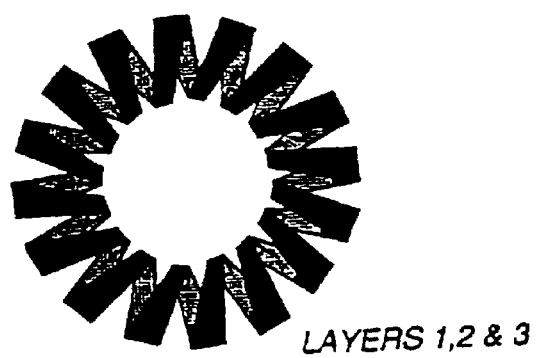
FIG. 14 — LAYERS 1, 2 & 3

INTEGRATED RADIO FREQUENCY CIRCUITS

This is a divisional of prior application Ser. No. 09/948,271, filed Sep. 6, 2001, now abandoned which is a continuation-in-part of application Ser. No. 09/792,848, filed Feb. 23, 2001, now abandoned which is a continuation-in-part of application Ser. No. 09/596,486, filed Jun. 19, 2000, which is a continuation-in-part of application No. 09/580,713, filed May 30, 2000 now abandoned.

BACKGROUND

This invention relates generally to radio frequency (RF) integrated circuits that include active devices and passive components such as inductors and capacitors used for radio frequency devices such as cellular telephones and wireless network devices such as Bluetooth and other wireless devices and personal digital assistants.

The technology for manufacturing integrated circuits has conventionally divided integrated circuits into various categories based on the compatibility of processes and other considerations. Generally, radio frequency circuits have not been mixed with logic circuits in the same integrated circuit. Radio frequency circuits are analog circuits that are involved in filtering and detecting radio frequency signals such as cellular telephone signals. In contrast, logic circuits generally include transistors and other active components that form digital integrated circuit devices. Thus, for example, bipolar techniques may be utilized to manufacture radio frequency circuits and standard complementary metal oxide semiconductor (CMOS) processes may be utilized to manufacture logic circuits.

Memory circuits may account for still another category. Generally, special processes may be utilized in connection with the manufacture of memory circuits because of special design considerations such as multiple gate electrodes and special voltage supply needs. Thus, memory circuits are often fabricated separately from logic circuits.

Still another category are the so-called mixed signal circuits that may include both digital and analog components. These signals too may be accounted for separately so that a device that includes RF signal processing, RF integrated circuits, mixed signal circuits, logic circuits and memory circuits may be made up of a number of separately fabricated integrated circuit chips.

The cost of an electronic device may be closely correlated to the extent of integration that is possible. The more devices and the more types of devices that can be integrated into a single integrated circuit and manufactured using highly replicated techniques, the lower the resulting price. Unfortunately, because of incompatibilities between the different types of integrated circuits, it has not been possible, to date, to fabricate both radio frequency circuits, mixed signal circuits, logic circuits and memory circuits all on the same standard CMOS integrated circuit process.

One problem that arises in connection with radio frequency circuits in CMOS processes is that the passive components such as capacitors and inductors may be adversely affected by the substrates over which they are formed. In particular, coupling may occur between the substrate and integrated circuit inductors for example. This coupling may result in degraded performance of inductive circuits. As a result, inductive circuits may be formed in bipolar or silicon over insulator (SOI) integrated circuits rather than using standard CMOS logic processes. Thus, two or more integrated circuits are needed—one for logic, one for RF circuits, one for memory, and one for mixed signals.

Some efforts have been made to overcome this coupling problem. For example, Silicon Wave Inc. has devised a so-called silicon over insulator (SOI) BiCMOS (Bipolar CMOS) integrated circuit that integrates both logic and radio frequency components onto the same die. However, the use of silicon over insulator technology greatly complicates the manufacturing process and increases cost. Moreover, the bulk of semiconductor fabrication facilities in the United States and the rest of the world are dedicated to manufacturing metal oxide semiconductor technologies. The SOI process is not amenable to widespread manufacturing at a number of highly expensive, already existent, fabrication facilities.

Another problem that arises in integrating radio frequency components with other devices is the need to include on chip logic circuits. These logic circuits may include processor or other devices utilized in some cases to control the overall radio frequency integrated circuit. Because of impact ionization and other causes, including the high switching speeds encountered in some logic circuits, the logic circuits may generate noise that may adversely effect the operation of on chip radio frequency components.

Thus, there is a need for ways to integrate both radio frequency and logic circuits on the same chip.

BRIEF DESCRIPTION OF THE DRAWINGS

FIG. 11 is a top plan view of layer one in the embodiment shown in FIG. 9;

FIG. 12 is top plan view of layer two in the embodiment shown in FIG. 9;

FIG. 13 is a top plan view of layer three in the embodiment shown in FIG. 9;

FIG. 14 is a front elevational view of the combined effect of the layers one through three in forming an inductive element;

DETAILED DESCRIPTION

Figure 1:
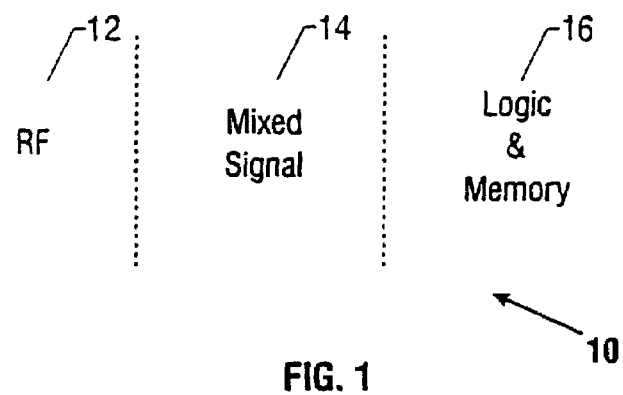
FIG. 1 is a depiction of the various families of integrated circuit technologies that may be fabricated on the same integrated circuit in accordance with embodiments of the present invention.

Referring to FIG. 1, an integrated circuit 10 may include analog circuit elements operating above 100 megahertz, such as RF components 12, mixed signal components 14 and logic and memory components 16, all integrated within the same monolithic integrated circuit. Coupling between the radio frequency circuit elements, such as inductors, capacitors and transistors and the substrate can be reduced, if not effectively eliminated, by creating an effective reverse biased diode between the radio frequency component and the substrate. This reverse biased diode may be formed using a triple well fabrication process in which an inductive circuit element and a transistor are formed over separate triple wells.

In addition, memory components such as flash memory and static random access memory (SRAM) may be made on the same process, in the same substrate, utilized to form logic circuits such as microprocessors and digital signal processors. For example, the processes disclosed in U.S. Pat. Nos. 5,926,418 and 5,867,425, assigned to the assignee of the present application, may be utilized to form both logic devices and flash memory.

Figure 2:
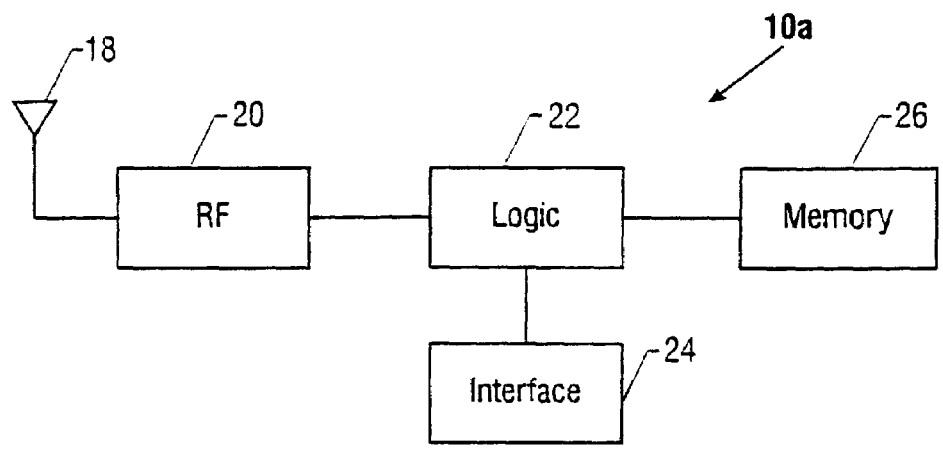
FIG. 2 is a block depiction of a cellular telephone in accordance with one embodiment of the present invention.

A radio frequency transceiver useful in a cellular telephone 10a, shown in FIG. 2, includes an antenna 18, a radio frequency section 20, a logic section 22, a memory 26, and an interface 24. The interface 24 provides the graphical user interfaces that may be displayed on display screens to implement the functions of the cellular telephone 10a. The logic circuit 22 may also include a microprocessor that operates using a memory 26. In one embodiment of the present invention,-the memory 26 is a flash memory. The radio frequency section 20 may include a number of passive components including inductive circuits.

The radio frequency section 20 as well as the antenna 18 may be formed using integrated circuit techniques to create a single integrated circuit that includes all of the components 18, 20, 22, 24, and 26, in accordance with one embodiment of the present invention. In other embodiments, some but not all of the analog and digital components may be fabricated on the same integrated circuit chip.

Generally, complementary metal oxide semiconductor techniques may be utilized to form all of the components depicted in FIG. 2 on a single chip. However, in some cases, particular components may be split among two or more integrated circuits. However, the designer is free to position particular components on particular integrated circuits based on design considerations rather than process and technology incompatibilities. Again, the problem of coupling of unwanted signals to the RF components included in the radio frequency section 20 may be avoided by forming an effective reverse biased diode in the common substrate utilized to form all the components of the telephone 10a.

Similarly, an integrated transceiver 10b for a wireless network, for example in accordance with the Bluetooth specification may be fabricated using the same principles. The Bluetooth transceiver 10b includes an antenna 28 coupled to a radio 30. The radio 30 is coupled to a link baseband controller or link controller 32. A central processor unit 34 couples an interface 36 and a memory 38. In some embodiments of the present invention, the memory 38 may be a flash memory. All of the components may be integrated into a single chip in one embodiment.

Figure 3:
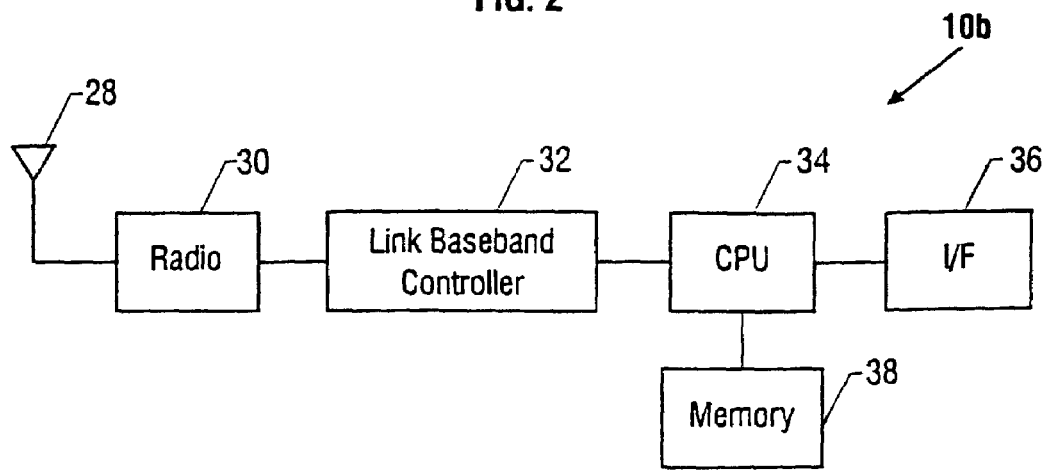
FIG. 3 is a block diagram of a Bluetooth transceiver in accordance with one embodiment of the present invention.
Figure 4:
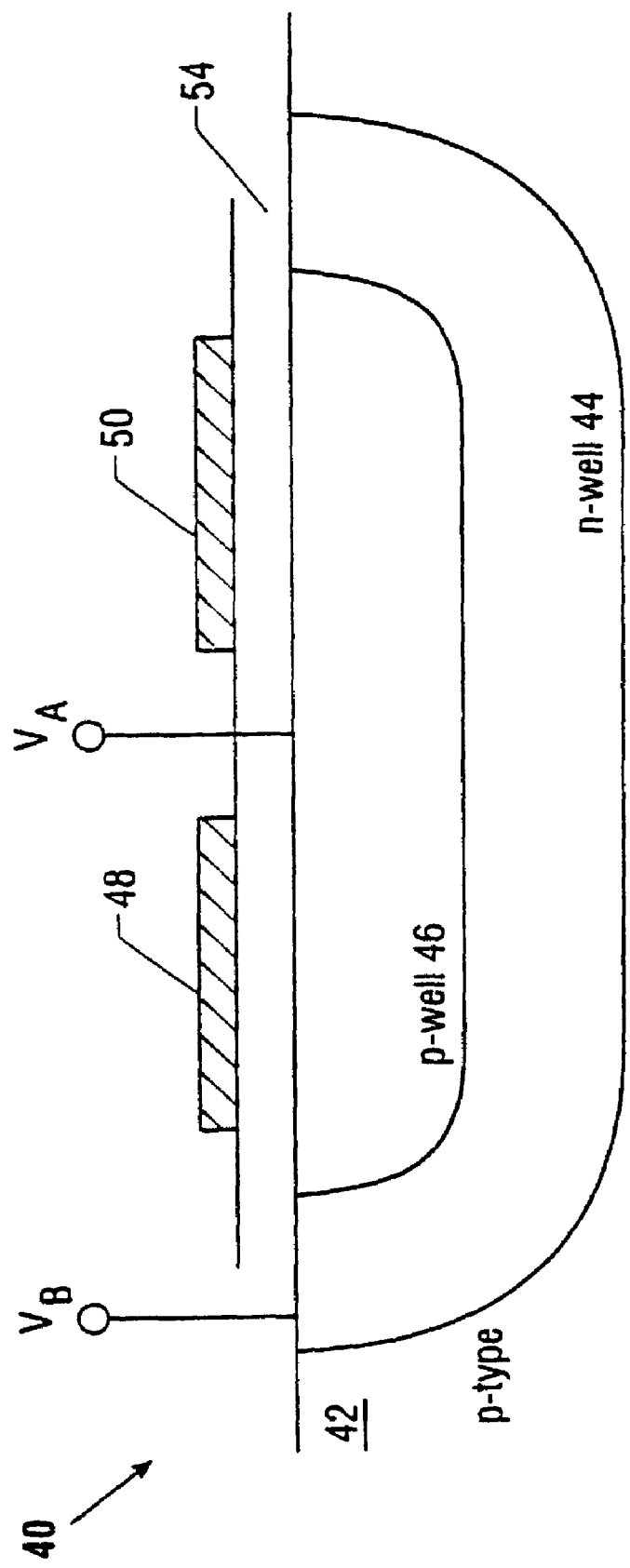
FIG. 4 is a greatly enlarged cross-sectional view of an inductive circuit element in accordance with one embodiment of the present invention.

An integrated radio frequency (RF) element 40 that may be utilized in connection with the RF section 20 or the radio 30 of the embodiments of FIGS. 2 and 3 or any other integrated circuit using an inductive element, is shown in FIG. 4. In this case, a triple well is defined within the substrate 42 by a P-well 46, a deep N-well 44, and the P-type substrate 42. The P-well 46 is a well or tub within the deep N-well 44.

Two reverse biased pn junctions are created, one by the juxtaposition of the P-well 46 and N-well 44, and another by the juxtaposition of the P-type substrate 42 and the N-well 44. Both pn junctions may be biased by a potential $V_B$ on the N-well 44. For example, if the P-well 46 and P-type substrate 42 are grounded, increasing the bias potential on the N-well 44 increases the bias on each junction. In some embodiments, if the N-well 44 is biased, the P-well 46 floats.

Depletion regions are formed by the junction bias, adding a depletion capacitance across the pn junctions between the P-well 46 and N-well 44 and between the N-well 44 and the P-type substrate 42. These depletion capacitances can be reduced by increasing the bias across the pn junctions. The higher the junction bias, the more reduction in the junction capacitance, reducing the total capacitance. Reducing total capacitance reduces the capacitive coupling of the RF circuits to the substrate and the self-resonance frequency of the inductive element 40. The reverse biased junctions reduce the coupling of noise or other unwanted signals between the substrate 42 and the RF integrated circuit components, formed over the substrate 42, such as the inductive element 50.

The layer 54 is conventionally formed of an oxide. Of course, the present invention is equally applicable to multi-layer metal processes in which the passive components, such as the inductive element 50, are formed in any desired metal layer.

In one embodiment, a triple well guard ring 55 may encircle the N-well 44. The guard ring 55 receives a contact for supplying the bias potential $V_B$.

The techniques for forming triple wells are well known. For example, U.S. Pat. Nos. 5,926,418 and 5,867,425 (assigned to the assignee of the present application) provide an explanation of exemplary processes for forming a triple well. The triple well process is equally applicable to manufacturing flash memory devices. By using the triple well process, a flash memory may be formed in the same integrated circuit with logic family-components such as processors and digital signal processors.

In one embodiment of the present invention, the N-well 44 may be formed by forming a deep N-well using a high energy implant. The resulting N-well extends generally parallel to the surface of the substrate 42. Thereafter, implanted N-wells may be formed to join up with each lateral edge of the deep N-well and to extend upwardly to the surface of the substrate 42. The lower the resistivity of the N-wells, the better the shielding of the resulting structure. Generally, the resistivity may be lowered by increasing the concentration of the dopant used to form the N-well 44.

Figure 5:
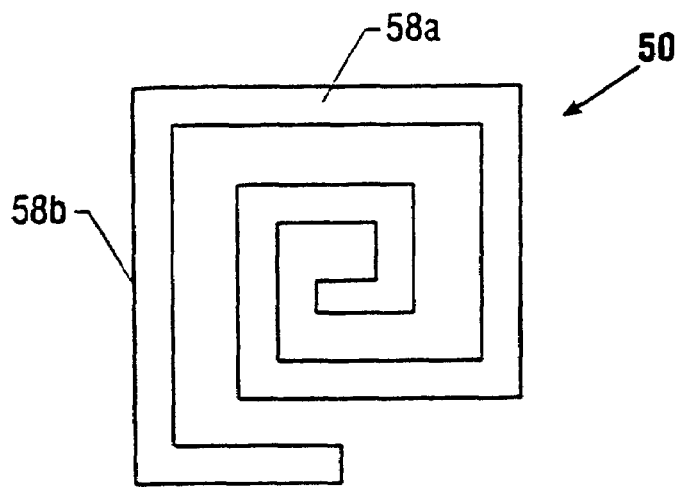
FIG. 5 is a greatly enlarged top plan view of an inductive element in accordance with one embodiment of the present invention.

Referring next to FIG. 5, the inductive element 50 may be formed of a planar, spiral-shaped layer defined over the substrate 42, for example atop an oxide layer 54. Conventionally, the inductive element 50 is formed by patterning and deposition techniques. However, any technique for forming the inductive element 50 may be utilized. The resulting structure may be formed of a spiral-shaped flat ribbon that may include a plurality of interconnected straight sections such as the sections 58a and 58b. Advantageously, the element 50 is positioned over the P-well 46 of the triple well 40. Appropriate electrical connections may be made through various layers to electrically couple the ends of the inductive element 50 to the rest of the integrated circuit.

Figure 7:
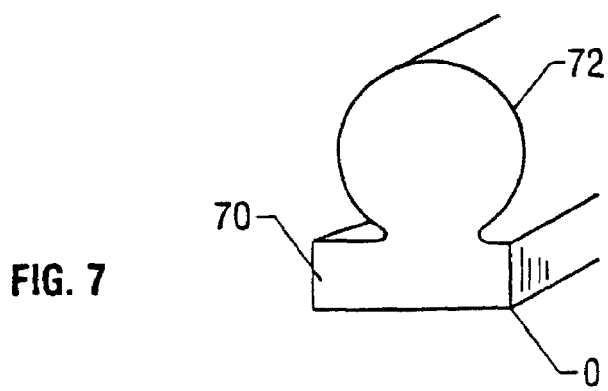
FIG. 7 is a perspective view of an embodiment of the inductive element shown in FIG. 5.

Alternatively a non-planar design may be used as shown in FIG. 7 and as described, for example in U.S. Pat. No. 5,545,916 to Koullias. The spiral inductive element 50, shown in FIG. 5, may have a non-planar cross-section as indicated in FIG. 7 including a rectangular portion 70 and a circular portion 72. Each of the trace elements 58c and 58d are arranged such that the material thickness favors the innermost edge "O". Thus, the trace shown in FIG. 7 is from the left side of the spiral inductive element 50 (shown in FIG. 5). The material is added close to an edge "O" where the current may flow at higher frequencies.

Figure 8A:
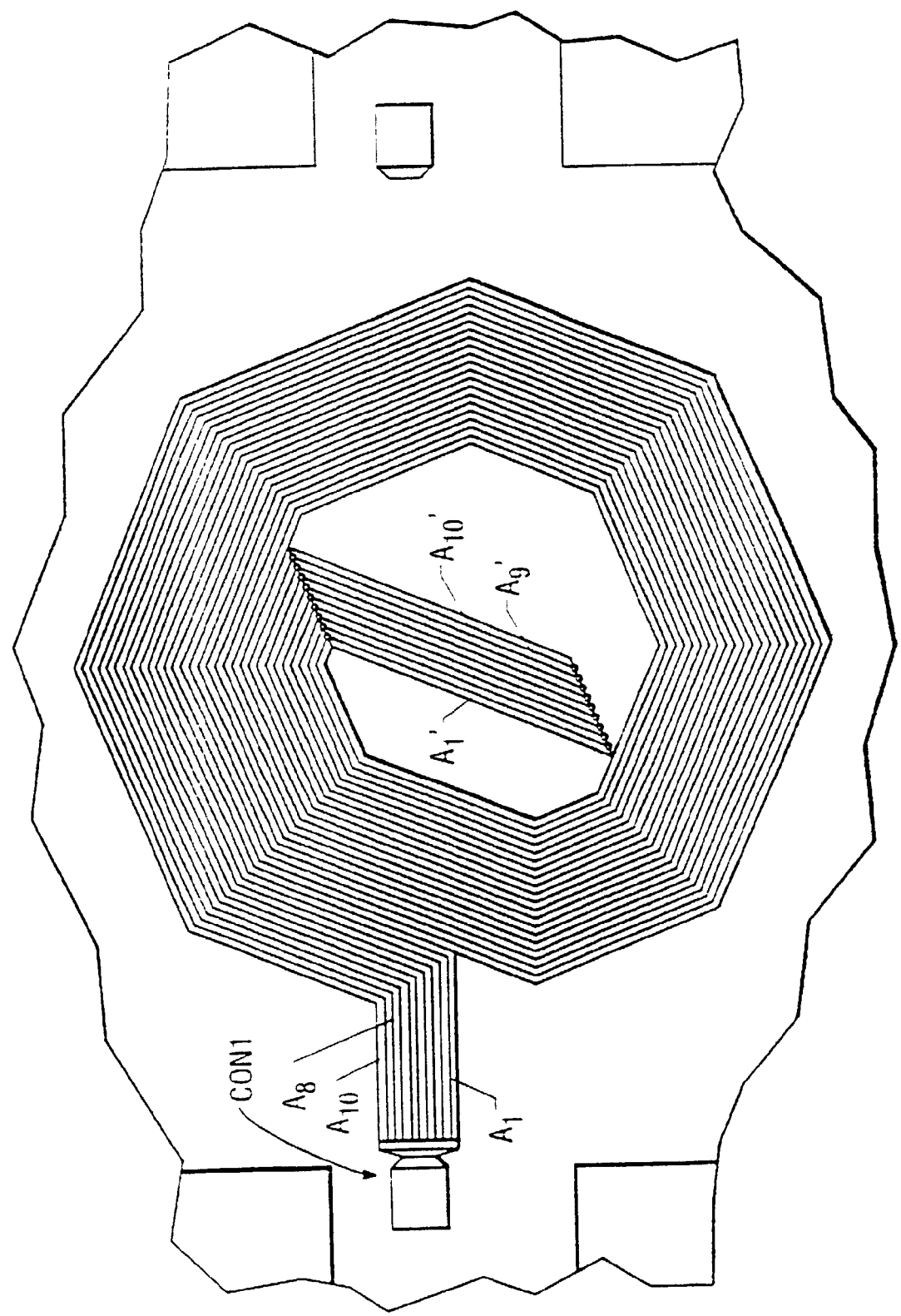
FIGS. 8A and 8B are top plan views of two different layers of an inductive element that may be used in the present invention.
Figure 8B:
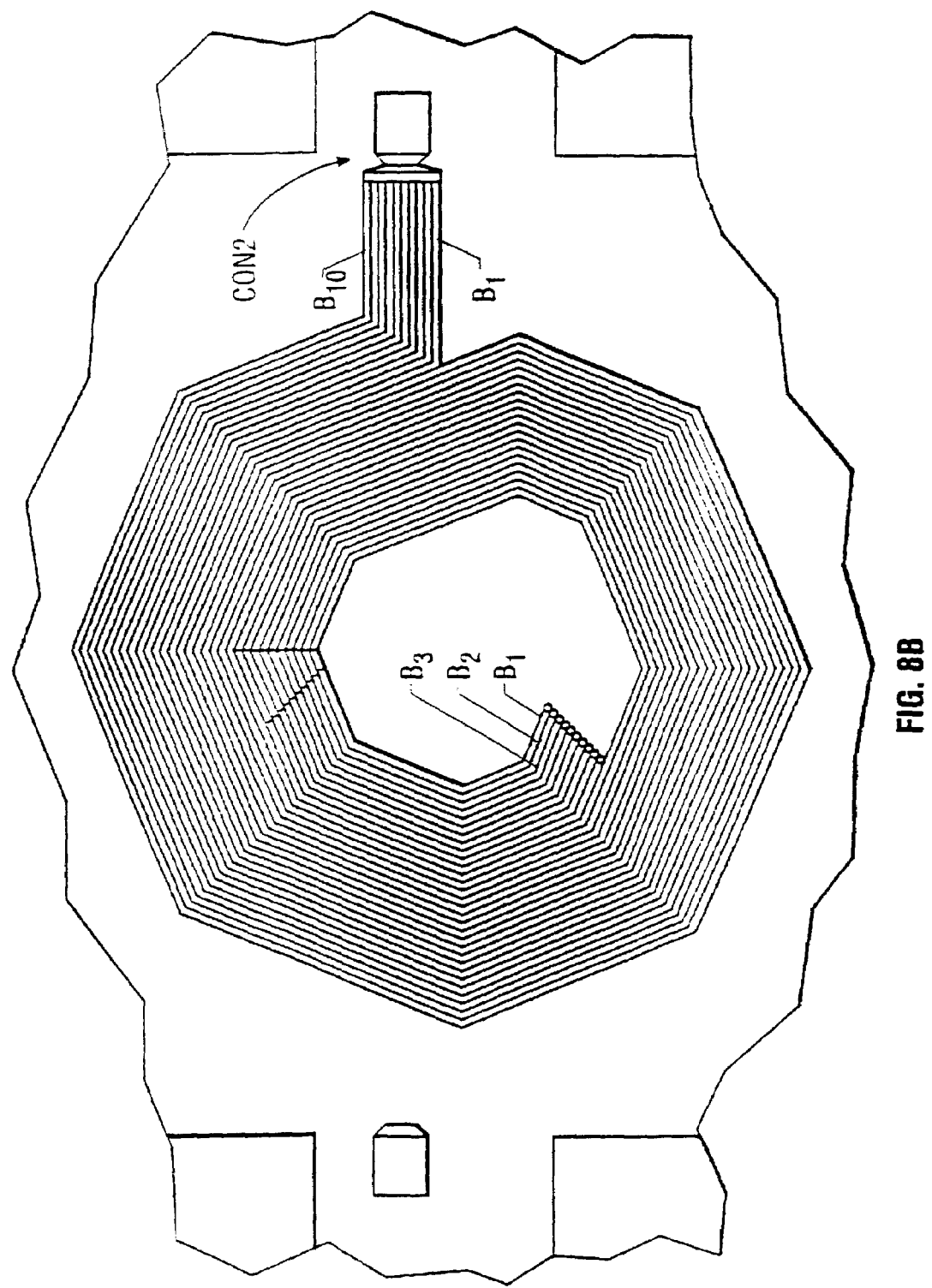

As another alternative, the spiral inductive element 50 may have a non-rectangular configuration such as the multilevel, multi-element polygonal design, for example, as set forth in U.S. Pat. No. 5,559,360, and as shown in FIG. 8. Referring to FIG. 8A, the layer with wires $A_1$ through $A_{10}$ has a first end A that is designated by the connective structure CON1. A group of ten connective wires, $A_{1'}$, $A_{2'}$, $A_{10'}$, are shown in the center of the spiral. The wires $B_1$–$B_{10}$ of the second layer, shown in FIG. 8B, are centrally connected to the wires $A_1$ through $A_{10}$ inverse sequentially. The output of the spiral inductive element is identified as a parallel connection CON2 in FIG. 8B that forms the parallel connections of all the elements of the B level. Through the use of multiple parallel conductive elements arranged on the substrate (in lieu of a single element conductive path), the resistance may be decreased and self-inductance increases. The decreased resistance and increased inductance may result in an improved quality factor (Q).

Figure 9:
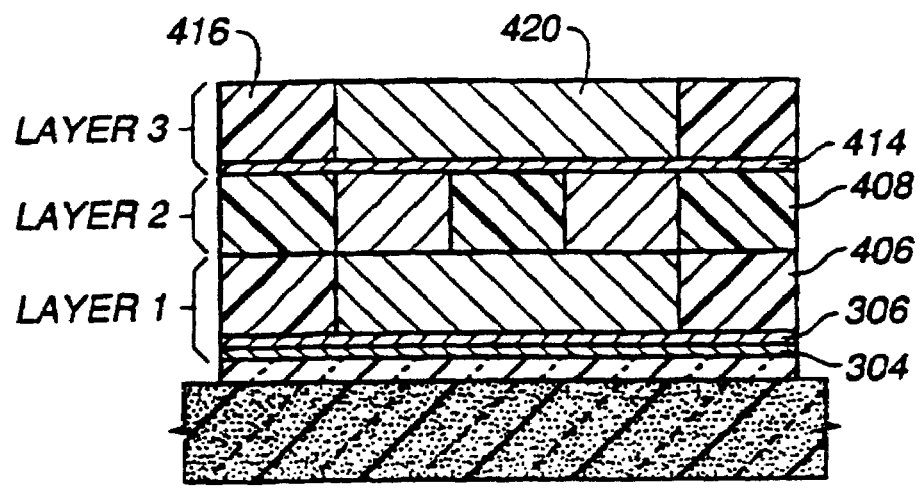
FIG. 9 is an enlarged cross-sectional view of still another embodiment of an inductive element that may be utilized in connection with the present invention.
Figure 10:
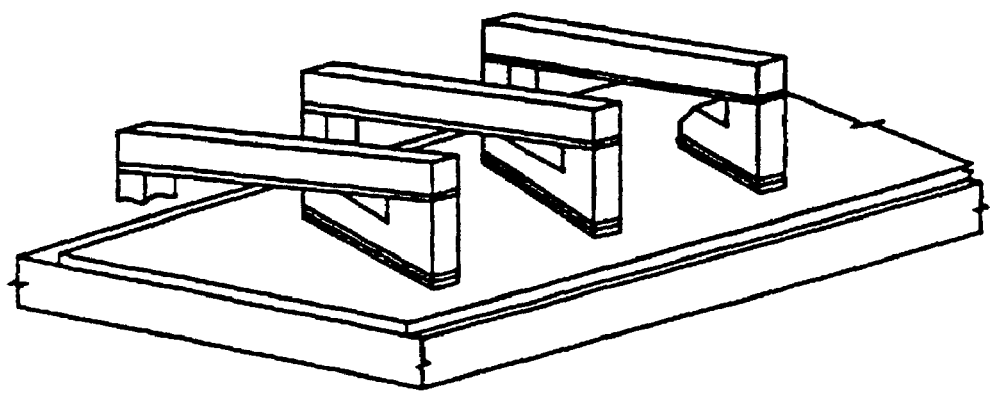
FIG. 10 is a perspective view of the inductive element shown in FIG. 9.

A multi-layer non-planar integrated inductor design, as shown in FIGS. 9 through 14, may also be used as the inductive element 50 (FIG. 5), as described in U.S. Pat. No. 6,008,102. A series of three conductive layers one, two, and three, are progressively coated one on top of another as shown in FIG. 9. The three layers combine to form an integrated helical coil as shown in FIG. 14. The first layer is formed of a conductive material in the shape shown in FIG. 11, the second layer is formed of a conductive material in the shape shown in FIG. 12 and the third layer is formed of conductive in the shape shown in FIG. 13. The net effect of the three layers is the coil shown in FIG. 14. The angular coil 450, shown in FIG. 10, has a series of multiple loops that are set perpendicularly to the plane of the substrate.

Referring again to FIG. 9, a layer 304 is coated over a passivated wafer. The layer 304 may be formed of a conductive material such as titanium-tungsten (TiW) to form a barrier layer and provide for the adhesion of a subsequently sputtered layer of copper 306. An initial photoresist layer 406 and a second photoresist layer 408 define the intervening conductive material. The layer 414 may be a sputtered conductor, and a layer 420 is a third layer of plated metal while the material 416 may be photoresist.

Figure 6:
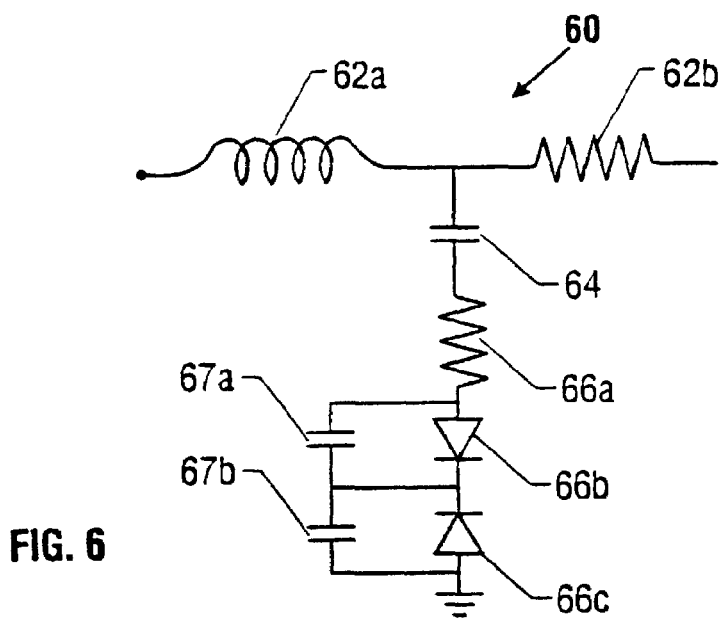
FIG. 6 is an equivalent circuit of the inductive element shown in FIGS. 4 and 5.

An equivalent circuit, shown in FIG. 6, for the inductive element 50 (FIG. 5) includes an inductance 62a that may arise from all or any part of the spiral-shaped inductive element 50. The inductive element 50 may also be represented by resistance 62b that arises from the natural resistance of the material utilized to form the spiral-shaped inductive element 50. A capacitance 64 arises from the capacitance between the inductive element 50 (or any other RF component such as transistors and capacitors) and the substrate 42 and particularly by the intervening dielectric layer 54. An additional resistance 66a may arise from the material utilized to form the P-well 46.

The effect of the pn junction created by the P-well 46 and the N-well 44 is represented by the diode 66b and the effect of the pn junction created by the N-well 44 and P-type substrate 42 is represented by the diode 66c. The capacitance 67b and the diode 66c reduce the coupling from the substrate 42 back to the inductor 50.

The reverse biased diode 66b, oriented oppositely to the diode 66c, reduces the inductive element 50 capacitive coupling losses to the substrate 42. Through the creation of the diode 66c, an effectively infinite resistance is created to reduce interference by substrate signals with the element 50 (and any other RF circuits). In particular, the inductive element 50 may be a highly tuned element that may be adversely affected by noise and other unwanted signals present in the substrate 42. These signals may be present in the substrate 42 due to the formation of a wide variety of other circuit elements in the same integrated circuit. These unwanted signals are isolated from the sensitive inductive element 50 by the reverse biased diode 66c.

As a result, a variety of different circuit types, including radio frequency circuit elements, mixed signal circuit elements, logic elements and memory elements, including flash memory elements, may all be formed in the same integrated circuit in the same substrate 42. Therefore, greater integration is possible and more efficient and lower cost radio frequency devices, such as Bluetooth transceivers and cellular telephones wireless local area networks, may be fabricated.

The benefits of the triple well can be further appreciated by comparing a triple well approach to an approach in which a single well such as a deep N-well is utilized below the inductive element 50. The impedance caused by the deep N-well, in a deep N-well embodiment, may be represented by the value $R_w$. The total impedance, Z, from the inductive element 50 to the substrate then may be represented by the equation:

$$Z = R_w + \frac{1}{j\omega C_w}$$

where C is the capacitance resulting from the oxide between the inductive element 50 and the substrate and the capacitance of the substrate and $\omega$ is the frequency. Similarly, the total capacitance, $C_w$, for the series, is expressed as follows:

$$\frac{1}{C_w} = \frac{1}{C_{OX}} + \frac{1}{C_{SUB}}$$

where $C_{OX}$ is the capacitance due to the dielectric between the inductive element 50 and the substrate and $C_{SUB}$ is the capacitance between the inductive element 50 and the substrate.

In contrast the total impedance, $Z_T$, of the triple well is expressed as (indicated as 64 follows:

$$Z_T = R_j + \frac{1}{j\omega C_T}$$

where $R_j$ is the resistance 66a of the N-well, P substrate and embedded P well and $C_T$ is the capacitance of the triple well (indicated as 64 in FIG. 6).

Similarly, the series capacitance created by the triple well, $C_T$, is as follows:

$$\frac{1}{C_T} = \frac{1}{C_{ox}} + \frac{1}{C_j} + \frac{1}{C_{SUB}}$$

where $C_{ox}$ is the capacitance 64 due to the oxide between the inductive element 50 and the substrate, $C_j$ is the capacitance 67a arising from the junction between the P-well and the N-well and $C_{SUB}$ is the capacitance 67b between the N-well and the substrate.

Since the impedance arising from the junction $Z_j$ is much greater than the impedance without the junction, the effect of the triple well is to substantially increase the impedance compared to a single deep N-well. Moreover, the capacitance created by the triple well can be adjusted by the N-well bias to be less than the capacitance created by the deep N-well. Thus, the coupling that results from the capacitance in the triple well is significantly less. Since the total impedance of the triple well is much greater than the impedance of the deep N-well and the capacitance of the triple well is less, there is less capacitive and resistive coupling to the substrate and also better noise isolation from the substrate to the RF circuits arising from the use of the triple well compared to the use of only a deep N-well.

The self-resonance frequency may also be improved in some embodiments, by reducing the total capacitance. The self-resonance frequency is proportional to 1/LC, so that the lower the capacitance, the higher the self-resonance frequency or the better the high frequency performance of the inductor 50. Reducing the capacitive coupling also improves the quality factor or Q of the inductor 50.

While an illustrated embodiment using a triple well is described, additional wells may be incorporated to form a series of one or more additional diodes in other embodiments.

Figure 15:
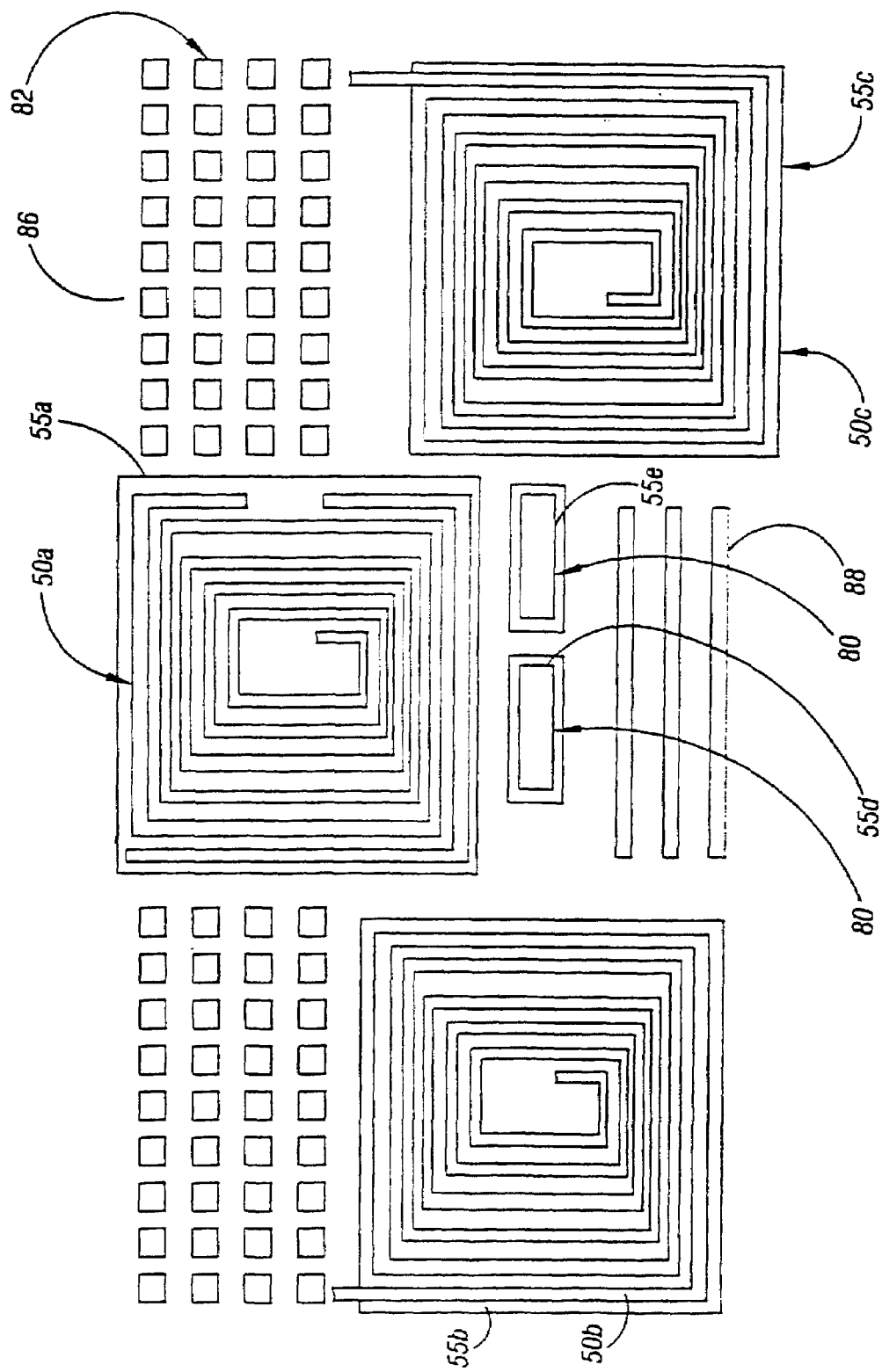
FIG. 15 is a top plan view of another embodiment of the present invention.

Referring to FIG. 15, in accordance with one embodiment of the present invention, each of the inductors 50a, 50b and 50c may be formed over their own separate triple well whose periphery is defined by a guard ring 55a, 55b or 55c. Each inductor 50, formed as a spiral, may connect at the center to a lower metal layer and may connect on the outside to a metal layer that defines the flat spiral.

Transistors 80 may be encircled by their own separate guard rings 55d and 55e. In other words, each transistor 80 may be formed in its own separate triple well whose periphery is defined by a guard ring 55d or 55e. In this way, the transistors 80 are isolated from noise from the underlying substrate.

A plurality of capacitors 82 may be formed over the substrate as metal to metal stacked capacitors. The capacitors 82 may be formed over a field oxide 86. Thus, the capacitors 82 that may include one plate elevated above another plate may be isolated from the substrate by the field oxide 86. In some embodiments, it may not be necessary to include underlying triple well below the capacitors 82. Similarly, because the resistors 88 are formed above the substrate, no triple well may be provided for the resistors 88 as well, in one embodiment.

Thus, in some embodiments of the present invention, each inductor may be formed over in its own triple well and one or more transistors may be included, each in its own separate triple well. Using individual triple wells may improve the electrical performance of the isolated circuit elements.

For example, voltage controlled oscillators (VCOs) may be formed in which transistors, varactors, and inductors are each formed, each over or in its own separate triple well. In some embodiments, resistors and capacitors may be formed over the substrate without an underlying triple well.

Figure 16:
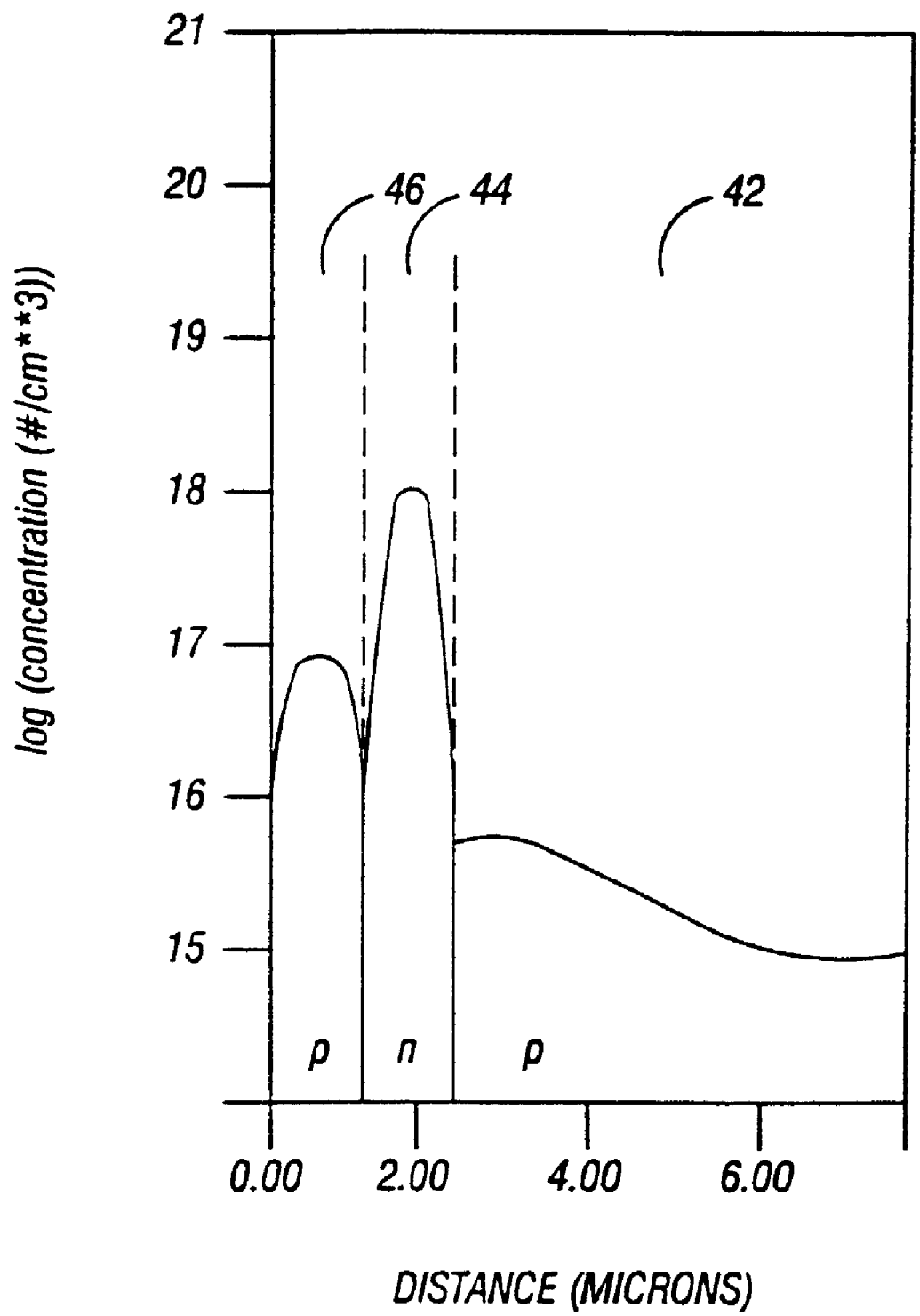
FIG. 16 is a plot of concentration versus distance in accordance with one exemplary embodiment of the present invention.

A hypothetical doping profile from the surface of the substrate 42, shown in FIG. 4, extending through the P-well 46, N-well 44 and down to the underlying substrate 42 is shown in FIG. 16. In this example, the P-well 46 (having an illustrative depth of about 1.5 microns) has a non-retrograde or symmetrical profile and an illustrative peak concentration of $10^{17}$ atoms/cm$^3$. The N-well 44 (in this example with a depth of from about 1.5 to 2.5 microns with an illustrative peak concentration of $10^{18}$ atoms/cm$^3$) has a symmetrical doping profile. Finally the P-type substrate extends downwardly below the N-well 44 (and has an illustrative peak doping concentration of $10^{16}$ atoms/cm$^3$).

By minimizing the doping concentration of the substrate 42 and (in fact making it conventional background doping in one example), the capacitance and the high frequency performance of the resulting product may be improved. In particular, the higher the doping concentration of the substrate 42, the lower the resistance and the better the low frequency performance. Conversely in such case, higher frequency performance may be degraded. Thus, by reducing the doping concentration in the substrate, the high frequency performance can be improved. In particular, the doping of the substrate 42 region immediately adjacent, bordering or abutting the N-well 44 may be less than that of the P-well 46.

In some cases the lower frequency performance may also be improved merely by varying the bias ($V_A$) applied to the P-well 46. In other words, the higher the bias potential applied to the P-well 46, the better the high frequency performance.

The doping level of the P-well 46 may be just sufficient to prevent punch-through of the P-well 46 to N-well 44 junction. Only three layers may be utilized in one embodiment.

Figure 17:
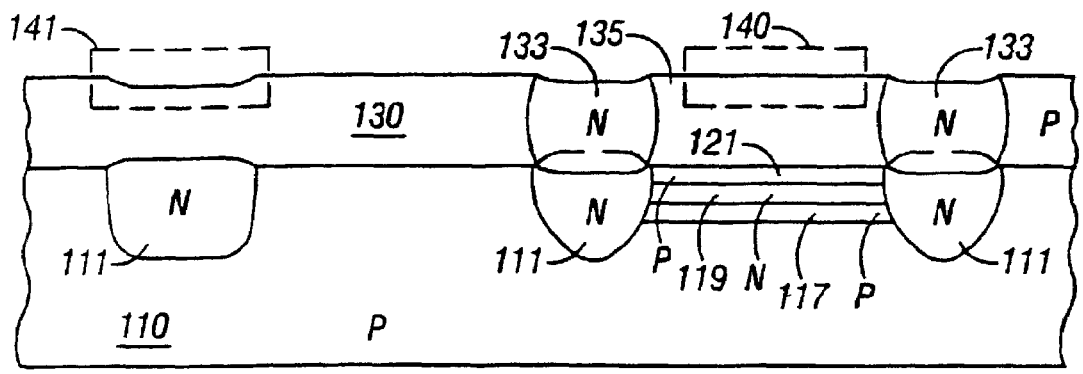
FIG. 17 is an enlarged, cross-sectional depiction of an embodiment in the prior art.
Figure 18:
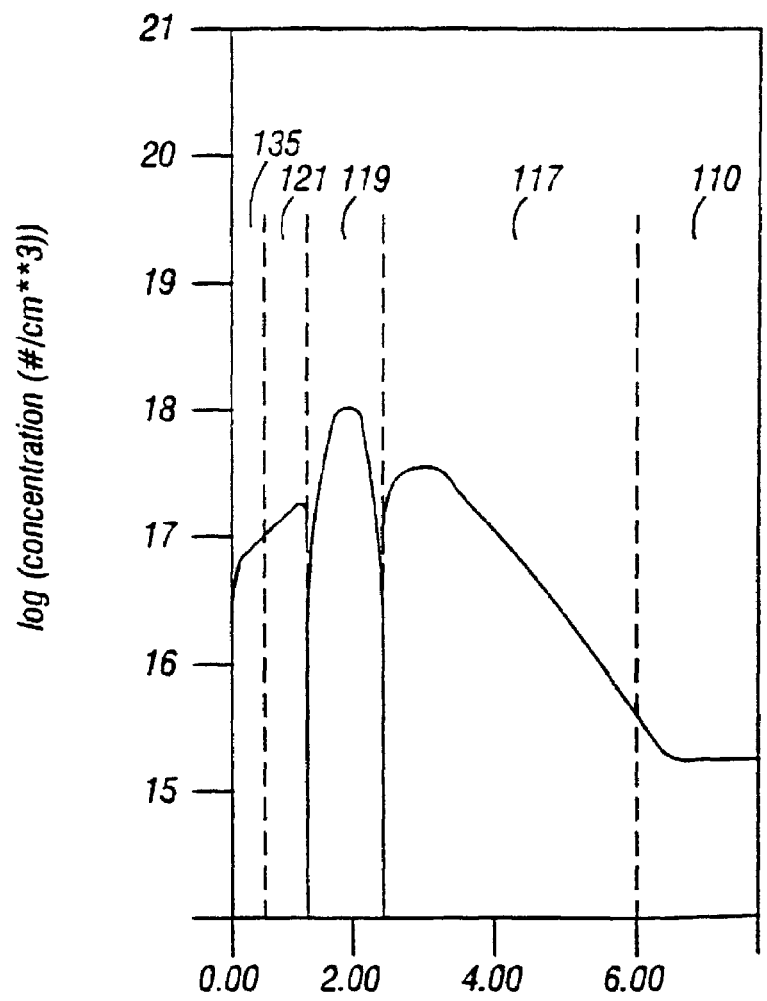
FIG. 18 is a plot of concentration versus distance into the substrate in the embodiment shown in FIG. 17.

In an embodiment in accordance with the prior art, shown in FIGS. 17 and 18, a plurality of layers 135, 121, 119, 117 and 110 are utilized to provide isolation in a BiCMOS device. See U.S. Pat. No. 5,268,312 to Reuss et al. In Reuss, five separate regions are utilized and a ground shield 117 is necessary. By increasing the doping concentration of the ground shield 117, the resistance may be minimized, thereby improving low frequency performance. However, since the characteristics of the device are then fixed, little or nothing can be done to improve the performance at high frequencies. In addition, the retrograde doping profile in the regions 135 and 121 is needed. Separate layers must be provided to achieve the retrograde profile.

No such retrograde profile is necessary in some embodiments according to the present invention. In addition, an epitaxial layer 135 is unnecessary in the CMOS structure disclosed in FIG. 4.

Figure 19:
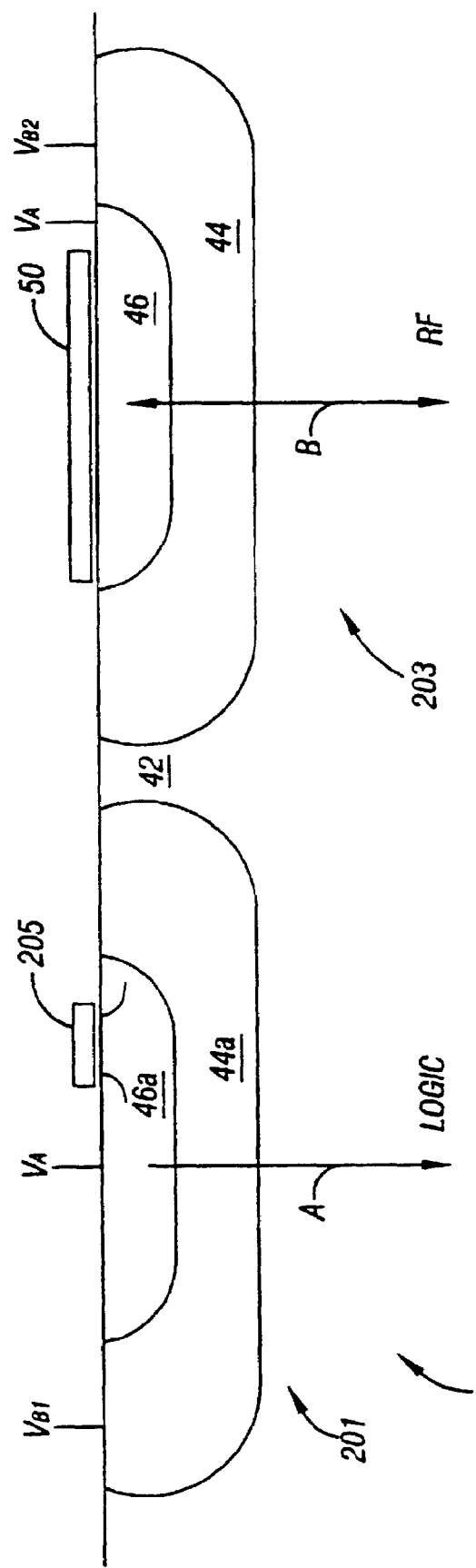
FIG. 19 is a cross sectional depiction of an integrated circuit that has been greatly enlarged, in accordance with one embodiment to the present invention.

Referring to FIG. 19, an integrated circuit 200 includes a logic section 201 and a radio frequency section 203. The logic section 201 may include conventional logic transistors such as the transistor 205, which may be utilized to provide conventional logic function, such as a processor or controller as one example.

In one embodiment, the logic section 201 may be utilized to control an integrated circuit 200, which has radio frequency applications. The logic section 201 may be formed inside a triple well which includes a P-well 46a, an N-well 44a, and a substrate 42. A bias potential may be applied to the N-well 44a as indicated at $V_{B1}$. A bias potential $V_A$ may be applied to the P-well 46a.

The arrangement of the triple well 201 may be effective to prevent noise injection (indicated by arrow A) from the logic section 201 to the rest of the substrate 42 and particularly to the radio frequency section 203. This noise may be generated, for example, due to transistor 205 switching in the logic section 201.

Likewise, the radio frequency section 203 may include at least one inductor 50 arranged over a P-well 46. The P-well 46 is part of a triple well including an N-well 44 and a substrate 42. As described previously and as indicated by the arrows B, the triple well is effective to prevent migration of noise to or from the inductor 50 or other components in the radio frequency section 203.

In the illustrated embodiment, the N-well 44 may be subjected to a bias $V_{B2}$. Similarly the P-well 46 may be subjected to a bias $V_A$.

A separate voltage supply may be utilized for the logic section 201 and radio frequency section 203. This may reduce the possibility of cross talk between these sections. In particular, it may be desirable to connect $V_{B1}$ and $V_{B2}$ to separate pins on the integrated circuit 200 so that separate power supplies may be utilized to reduce cross talk. It is not necessary that $V_{B1}$ and $V_{B2}$ be different voltages however. In addition, a plurality of triple wells may be utilized for a plurality of radio frequency components. In some cases those radio frequency components may use different bias voltages $V_{B2}$ or they may all use the same bias voltage $V_{B2}$. However, it is desirable in some embodiments, to use separate voltages $V_{B1}$ and $V_{B2}$ for logic and radio frequency components on the same integrated circuit 200.

In some embodiments, it may be desirable to use a lighter doping for the P-well 46 relative to the P-well 46a. The lighter doping may be effective in reducing eddy currents from inductive component 50. A normal doping level may be utilized for the P-well 46a in one embodiment. For example, the doping level for the P-well 46 may be approximately $10^{15}$; while the doping level for the P-well 46a may be $10^{16}$ to $10^{17}$ atoms per cubic centimeter.

In some embodiments, the logic circuitry may use complementary metal oxide semiconductor (CMOS) technology that includes both N-channel and P-channel transistors. Of course, the P-channel transistors are not generally included in triple wells while the N-channel transistors are so included. However, impact ionization that results in noise is substantially greater in the case of N-channel transistors than in P-channel transistors. Thus, the techniques described herein may be effective in reducing noise injection in the substrate 42 even in embodiments where only the N-channel transistors are placed in triple wells. Radio frequency circuitry generally uses N-channel technologies and therefore, the use of triple wells may be effective.

Figure 20:
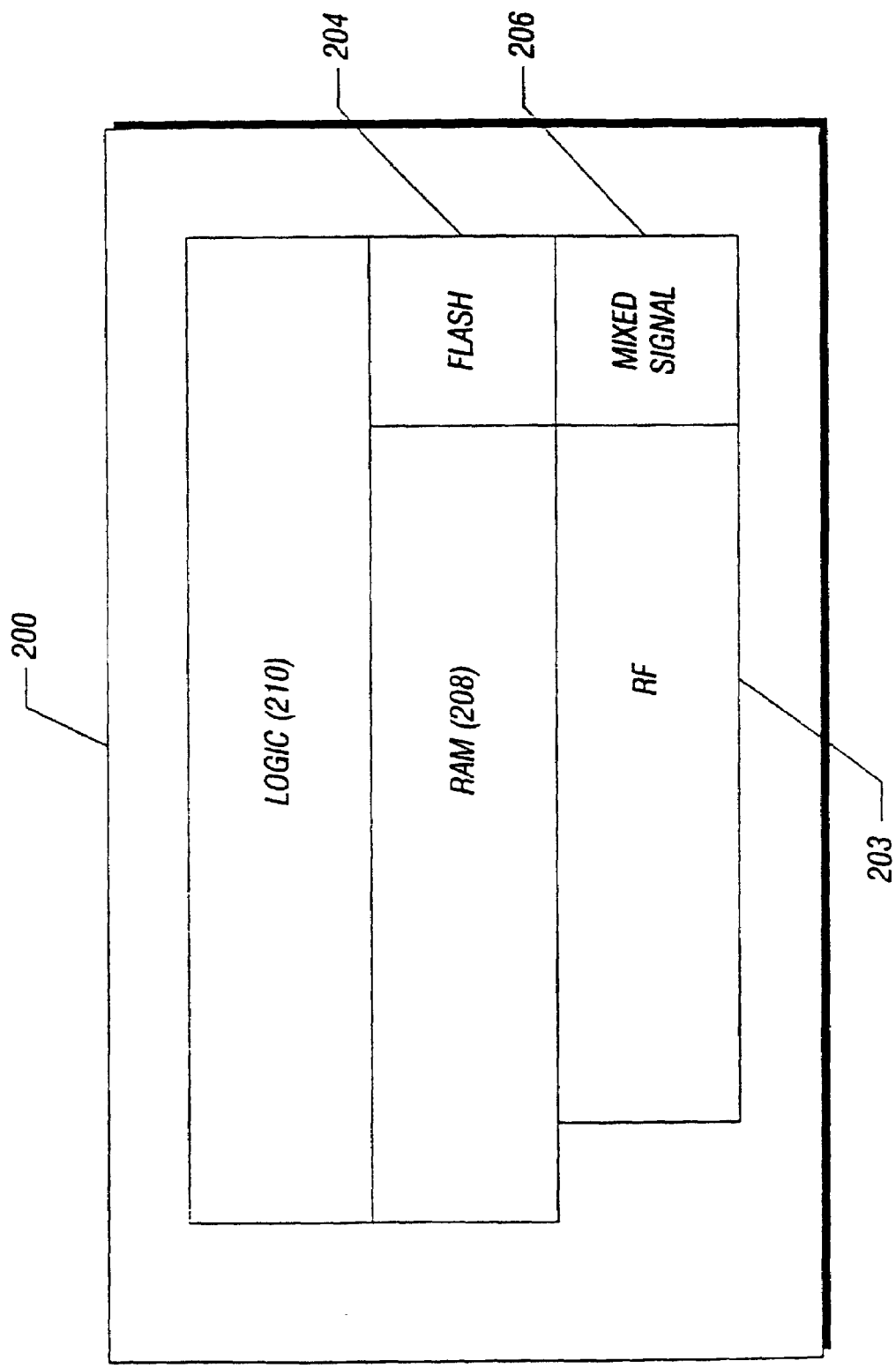
FIG. 20 is a layout in accordance with one embodiment of the present invention of the circuit shown in FIG. 19.

Turning now to FIG. 20, an exemplary layout for integrated circuit 200 that integrates onto one chip a radio frequency section 203, a flash memory 204, a mixed signal section 206, a random access memory (RAM) 208, and a logic section 201. In some cases, each of the sections 201 through 208 may utilize separate bias voltages and may be contained in separate triple wells. In some cases, individual components within any of the sections 201 is through 208 may be in their own triple wells.

The mixed signal section 206 may include, for example, digital to analog and analog to digital converters. The radio frequency section 203 may include components such as a frequency synthesizer, a phase locked loop (PLL) device, a voltage controlled oscillator (VCO), a mixer, a power amplifier, a low noise amplifier (LNA) and clocks, as a few examples. It may be desirable to space the mixed signal section 206 from the radio frequency section 203 in some embodiments.

Of course, the layout shown in FIG. 20 is simply one exemplary layout and any of a variety of layouts may be utilized. In some cases, it may be desirable to physically separate the radio frequency section 203 from the logic section 201, for example.

Figure 21:
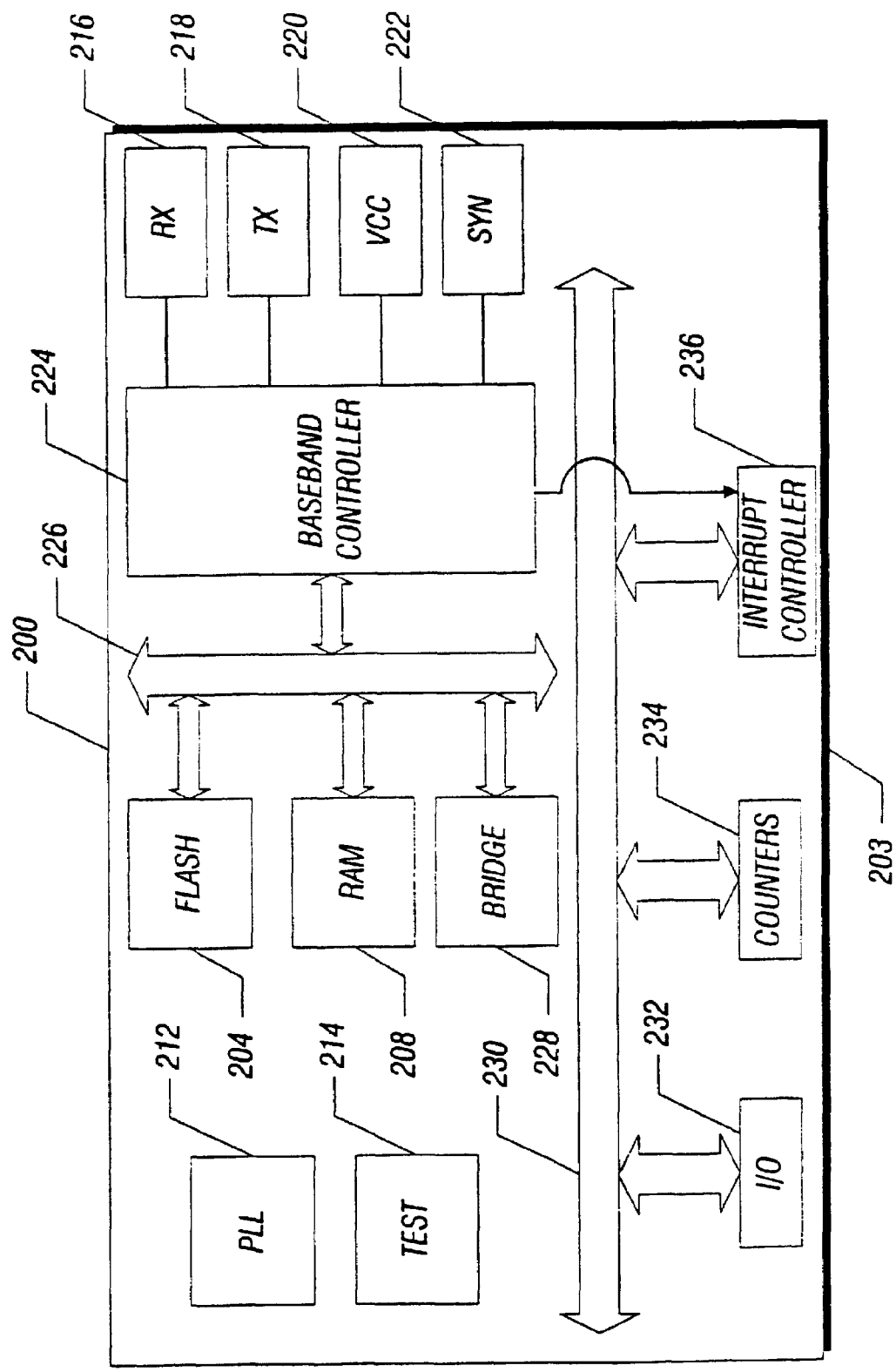
FIG. 21 is a block depiction of one embodiment of the integrated circuit shown in FIGS. 19 and 20.

Turning next to FIG. 21, a block depiction of a radio frequency integrated circuit 200 in accordance with one embodiment to the present invention is illustrated. In this example, a baseband controller 224 may be coupled to a receiver 216, a transmitter 218, a voltage controlled oscillator 220 and a frequency synthesizer 222. The baseband controller 224 may include logic circuitry and may be implemented by logic components as described previously. The baseband controller 224 may be coupled over a bus 226 to a flash memory 204, a RAM memory 208, and a bridge 228.

The bridge 228 may couple through a bus 230 to an input/output device 232, a group of counters and timers 234, and an interrupt controller 236. The integrated circuit 200 may include a variety of other components including a phase locked loop 212 and test circuitry 214 for example for implementing JTAG procedures. Thus, the integrated circuit 200 may functionally utilize a plurality of devices that may include logic, radio frequency, or mixed signal components. Those components may be laid out so that these types of components are physically segregated on the integrated circuit even though they also may be coupled by connections bridging the various sections such as a logic section 201, the flash section 204 and the like.

By placing the radio frequency section 203 components and logic section 201 components in separate triple wells, the sensitive radio frequency components may be isolated from noise emitted by the logic components, for example due to impact ionization and high switching rates.

Figure 22:
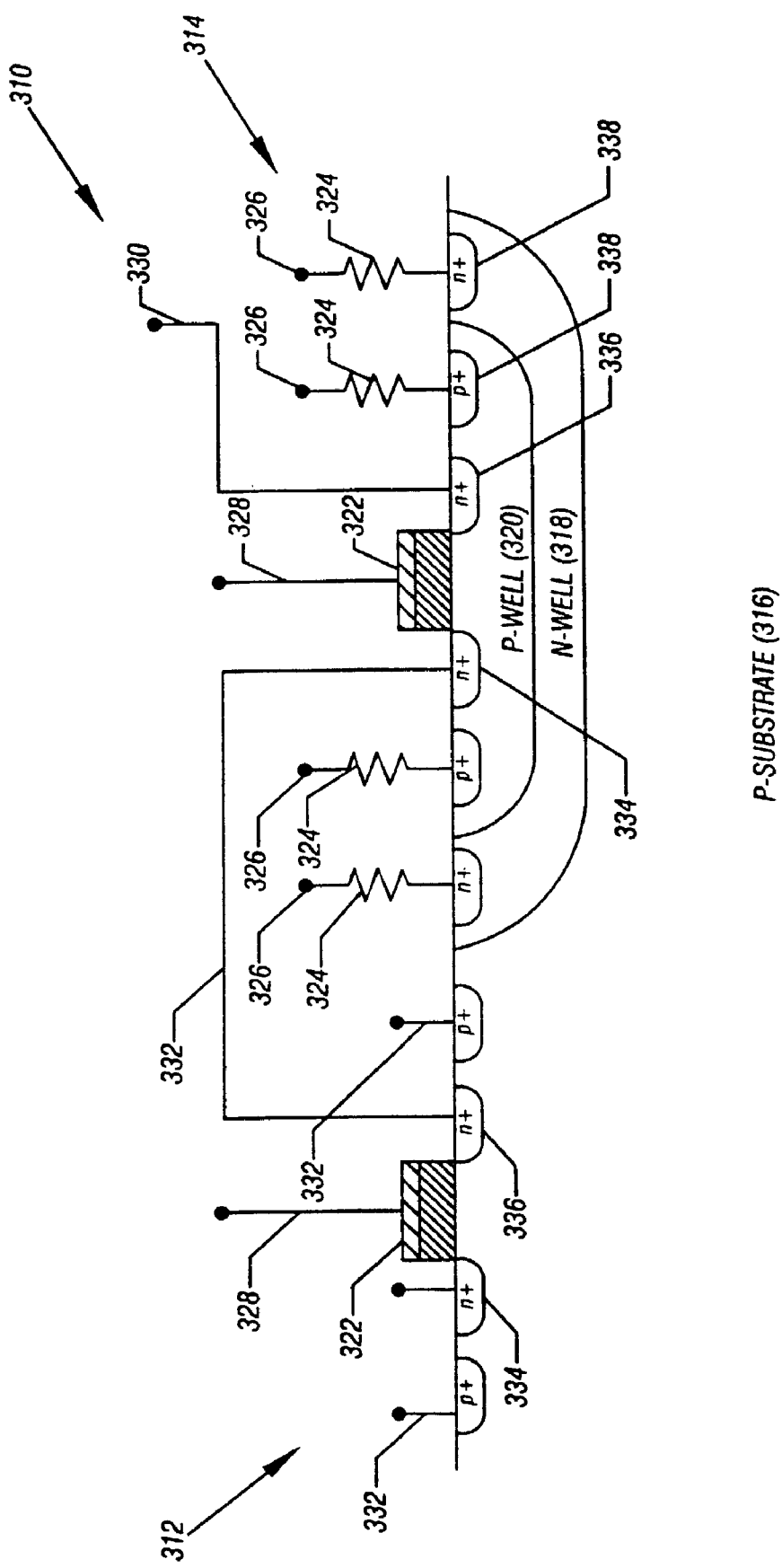
FIG. 22 is an enlarged cross-sectional depiction of another embodiment of the present invention.

Referring to FIG. 22, a cascode circuit 310 includes a first transistor 312 coupled to a common gate transistor 314 formed in a triple well. The triple well includes a P-well 320, an N-well 318 and a P-type substrate 316. The drain 336 of the transistor 314 is coupled to the output node 330 and the source 334 is coupled via the line 332 to the drain 336 of the transistor 312. The gates 322 of each transistor 312 or 314 are coupled to a gate node 328. The contacts 332 connect to contact diffusions that are formed in the substrate 316. The lines 332 may be coupled to ground. The wells 318 and 320 of the transistor 314 may be coupled through resistors 324 to biased nodes 326.

The use of the triple well applied to the common gate transistor 314 of the cascode 310 reduces the output shunt capacitance to achieve higher output bandwidth. The well 320 may be a lightly doped P-type well inside a lightly doped N-type well 318. The common gate transistor 314 is placed inside the triple well to reduce the output shunt capacitance by adding two series capacitors from the output drain node 330 of the common gate stage to the substrate node. The two series capacitors are formed by the two triple well P-N junctions, i.e. the junction between the P-well 320 and the N-well 318 and the junction between the N-well 318 and substrate 316. The lightly doped nature of the triple well allows further improvement by reducing the capacitance of the resulting P-N junctions. Furthermore, the wells 318 and 320 are biased through high value resistors 324 to maintain isolation between the drain node 330 and substrate 316.

Thus, the cascode circuit 310 may formed in any integrated circuit including those that also include integrated inductors and capacitors, for example to form radio frequency circuits. As a result, the output capacitance is reduced, increasing the available output bandwidth.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming a first triple well including a P-type and an N-type well in a substrate; forming a first transistor of a cascode circuit over said first triple well;
   coupling a source region of the first transistor to a drain region of a second transistor of the cascode circuit;
   coupling a gate of the first transistor to a gate of the second transistor;
   biasing the P-type and N-type wells of said first triple well through resistors;
   forming a second triple well including a P-type and an N-type well in the substrate proximate to the first triple well;
   forming an inductive element over said second triple well; and
   biasing the P-type and N-type wells of the second triple well through an external voltage supply.

2. The method of claim 1 wherein the external voltage supply is used to supply a voltage to the P-type and N-type wells of said first triple well.

3. The method of claim 1 including encircling the first transistor and the second transistor with corresponding guard rings.

4. The method of claim 3 including taking an output of said cascode circuit from the drain of said first transistor.

5. The method of claim 4, including biasing said P-type and N-type wells to isolate the output of said cascode circuit from the substrate.

6. The method of claim 5 including reducing the output shunt capacitance using said triple well.

7. The method of claim 1 including,
   doping the P-type well; and
   doping the N-type well.

8. The method of claim 7, wherein a peak dopant concentration of the P-type well is about $10^{17}$ atoms/cm$^3$ and a peak concentration of the N-type well is about $10^{18}$ atoms/cm$^3$.

9. The method of claim 1, wherein the inductive element is a spiral inductive element.

10. The method of claim 1, further comprising:
    encircling the N-type well of the second triple well with a guard ring.

11. The method of claim 1, further comprising:
    supplying a voltage to the P-type and N-type wells of said first triple well through a separate external voltage supply from the voltage supply.

12. The method of claim 11, wherein the voltage supplied to the N-type well of the first triple well is different from a voltage supplied to the N-type well of the second triple well.

13. The method of claim 10, further comprising:
    defining a contact on the guard ring through which the N-type well of the second triple well is biased.

14. The method of claim 1, wherein biasing the P-type and N-type wells of said first triple well through resistors includes,
    applying a voltage to the N-type well through multiple resistors; and
    applying a voltage to the P-type well through multiple resistors.

* * * * *